April 25, 1967 I. IMAHASHI 3,316,426

COUNTER WITH INTERSTAGE COUPLING-CIRCUIT AND GATE COOPERATING TO MOMENTARILY DISCONNECT COUNTER-STAGE SUPPLY TO EFFECT COUNTING

Filed April 27, 1965

INVENTOR.

ISSEI IMAHASHI

BY Blum Moscovitz, Friedman Blum and Kaplan

ATTORNEYS 3,316,426
Patented Apr. 25, 1967

3,316,426

COUNTER WITH INTERSTAGE COUPLING-CIRCUIT AND GATE COOPERATING TO MOMENTARILY DISCONNECT COUNTER-STAGE SUPPLY TO EFFECT COUNTING

Issei Imahashi, Nagano-ken, Japan, assignor to Kabushiki Kaisha Suwa Seiskosha

Filed Apr. 27, 1965, Ser. No. 451,132
Claims priority, application Japan, May 4, 1964, 39/25,082
10 Claims. (Cl. 307—88.5)

ABSTRACT OF THE DISCLOSURE

In a chain of bistable flip-flops, a switching error is produced in that the $(n+1)$th stage is triggered at the time the right hand side of the $n$th stage is switched in the non-triggering direction, thereby causing $(n+1)$th stage to be triggered twice. A coupling circuit is provided for interconnecting successive stages, consisting of a diode-capacitor series arrangement, connected between the collector output of the right hand transistor and the base input of the triggering transistor, which is connected to the common emitters of the switching transistors of the succeeding stage, and a charging resistor connected between the B+ supply terminal and the junction of the diode and capacitor. The diode is rendered conductive and non-conductive when the right hand transistor of the $n$th stage is respectively conductive and non-conductive thus enabling a charging current to flow through the capacitor, in the diode non-conductive state, thus preventing an error trigger pulse from being applied through the diode capacitor circuit to the succeeding trigger transistor.

Figure 1:
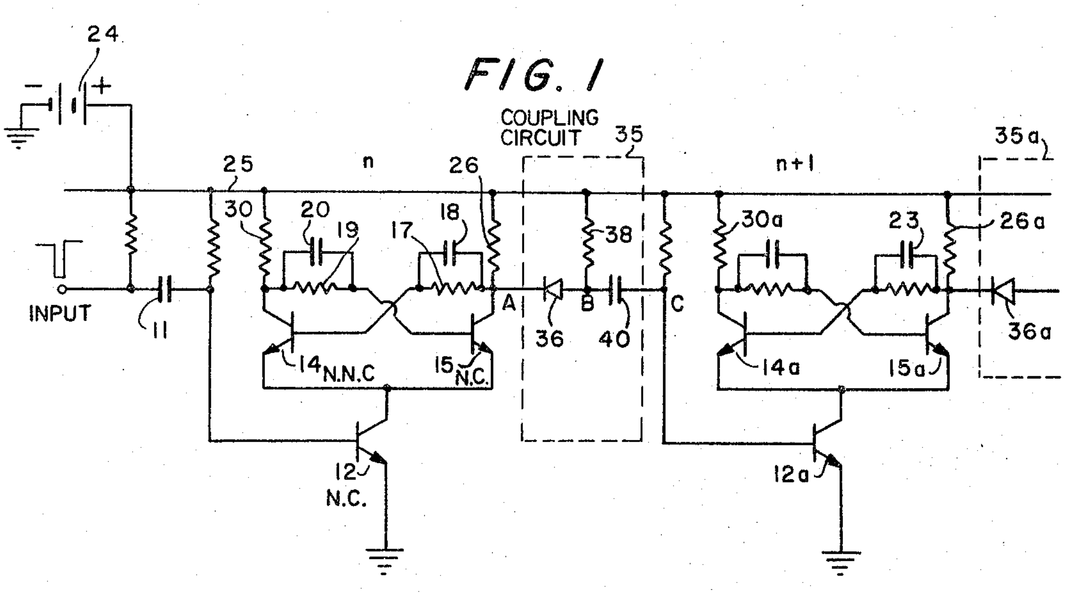

This invention relates to transistor switching circuits and more particularly to a connecting circuit for binary circuits.

It is known to connect together a plurality of binary circuits or flip-flops in a chain to from differeing systems such as binary counters as described for example in Millman and Taub, Pulse and Digital Circuits, McGraw Hill, 1956 at page 323 et seg. The flip-flops are connected one with the other in a continuous chain of stages and input pulses are applied to the first flip-flop of the chain. In prior chains of stages the flip-flops are interconnected so that the right hand side of each flip-flop is connected to an input of the next succeeding flip-flop of the chain. Thus when the right hand side of that flip-flop changes from one to the other of its stable states in a predetermined triggering direction a pulse is produced to switch the next succeeding flip-flop to change its stable state. It has been found that switching errors have been produced in that a flip-flop stage $(n+1)$ in the chain has been triggered at the time the right hand side of a flip-flop stage $n$ has been switched in its non-triggering direction. Thus the flip-flop $n+1$ is triggered two times instead of a single time by the flip-flop $n$ which results in an error output.

Accordingly an object of the present invention is a connecting circuit between flip-flops in a chain which prevents error triggering.

Another object of the invention is a connecting circuit between the $n$ and $n+1$ flip-flops which provides only a single triggering pulse to the $n+1$ flip-flop when the $n$ flip-flop switches in a predetermined triggering direction.

In accordance with the present invention there is provided a chain of flip-flop circuits with each flip-flop circuit including a pair of transistors having two stable states. In each pair of transistors, circuits respectively cross-connect the collector of each transistor to the base of the other transistor and each of the cross-connecting circuits applies a signal from the output of one transistor to the input of the other transistor for rendering one of them conductive when the other is non-conductive and vice versa. Triggering means are provided for each of the flip-flop circuits having applied thereto triggering pulses of polarity for rendering the conductive one of the pair of transistors non-conductive and for maintaining non-conductive the non-conductive one of the transistors. Upon termination of a triggering pulse the previously non-conductive transistor is rendered conductive thereby to switch the stable state of the flip-flop circuit. A connecting circuit is coupled between an output of one of the transistors of each flip-flop circuit and the triggering means of the next succeeding flip-flop and includes a diode. The diode is rendered conductive when the transistors to which it is connected is conductive and is rendered non-conductive when that transistor is non-conductive. In addition each of the connecting circuits includes a capacity connected between the diode and the triggering means. A source of supply produces a charging current for flow through the capacitor when the diode is rendered non-conductive. In this manner an error triggering pulse is prevented from being applied to the triggering means. On the other hand, when the diode and the transistor to which it is connected are rendered conductive a sharp triggering pulse is applied to the triggering means of the next succeeding flip-flop and only at that time is that next succeeding flip-flop switched to its stable state. In this manner by the use of a charging circuit error triggering pulse are eliminated and only the proper triggering pulse is applied to switch the next succeeding flip-flop.

Figure 2:
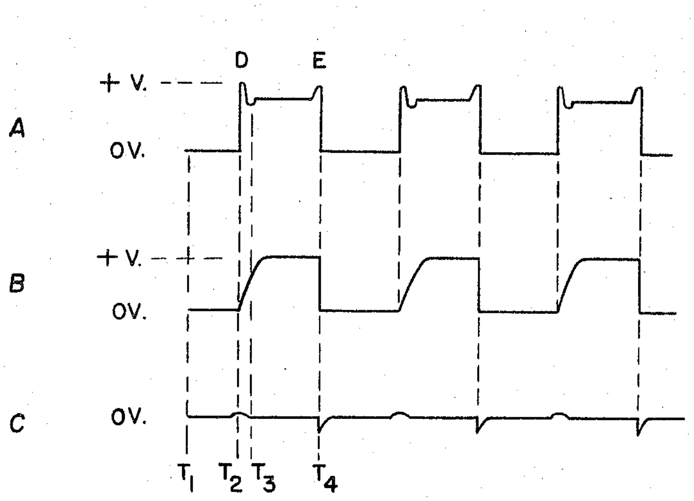

For a more detailed disclosure of the invention and for further objects and advantages thereof, reference is to be had to the following description taken in conjunction with the accompanying drawings in which:

FIG. 1 schematically illustrates two stages of a binary counter of the present invention; and FIG. 2 is a timing diagram helpful in the explanation of the operation of FIG. 1.

Though the present invention is applicable to $n$ stages of a chain such as a binary counter, only two stages $n$ and $n+1$ have been illustrated in FIG. 1. The operation of a binary counter is well known and input pulses are applied from a preceding flip-flop stage $n$ (not shown) and by way of a capacitor 11 to the base of triggering transistor 12 of the $n$ flip-flop. Since each of these flip-flops are of identical construction only one of them, stage $n$, need be described in detail and similar reference characters have been used with stages $n$ and $n+1$.

The collector of triggering transistor 12 is connected to both of the emitters of cross-connected transistors 14 and 15, illustrated as of the NPN type and forming a bistable circuit, i.e. having two stable states. To provide the cross-connections the base of transistor 14 is connected to the collector of transistor 15 by way of a resistor 17 having a capacitor 18 connected in shunt therewith. In addition, the other cross-connection is from the base of transistor 15 to the collector of transistor 14 by way of a resistor 19 having a capacitor 20 connected in shunt therewith.

For explanation it will first be assumed that flip-flop *n* has been switched to its stable state condition in which transistor 14 is off and transistor 15 is on. Triggering transistor 12 is normally on during steady state. With transistors 15 and 12 on or conductive a circuit for current flow may be traced by way of the positive side of a supply battery 24, conductor 25, a resistor 26*a*, the collector, base and emitter of conductive transistor 15, the collector, base and emitter of conductive transistor 12 to ground. Thus in the stable state with transistor 15 conductive the point A is at substantially ground potential as illustrated in in FIG. 2 at time $T_1$. It will also be understood that in this stable state condition with transistor 15 on and transistor 14 off that there is no current flow between point A and the base of transistor 14. Thus, no charge is stored by capacitor 18. On the other hand with transistor 15 conductive a current flow may be traced by way of the positive side of battery 24, conductor 25, a resistor 30, and through the parallel combination of resistor 19 and capacitor 20, the base and emitter of transistor 15, conductive transistor 12 to ground. In this manner capacitor 20 is charged with its left hand plate positive with respect to its right hand plate.

Upon application of a negative going triggering pulse to trigger transistor 12 at time $T_2$ that transistor is rendered cut off or non-conductive and this terminates the emitter current for conductive transistor 15 thereby cutting off that transistor. With transistor 15 turned off, the potential at point A goes immediately to the positive potential of battery 24 illustrated at point D of waveform A in FIG. 2.

As the negative triggering pulse to transistor 12 is of short time duration, trigger transistor 12 is turned on and transistor 14 is then turned on while transistor 15 is maintained in its cut off state for the following reason. It will be remembered that in the previous stable state condition of flip-flop *n*, capacitor 18 was not charged while capacitor 20 was charged with its left hand plate positively charged with respect to its right hand plate. Accordingly, when transistor 12 is turned on, transistor 15 is maintained non-conductive as a result of that charge on capacitor 20 while transistor 14 begins to conduct. As a result of feedback action in a cross-connected bistable circuit, transistor 14 is rendered fully conductive while transistor 15 is maintained non-conductive. In this manner it will be understood that the flip-flop *n* has been switched to the other of its stable states upon application of a trigger pulse to triggering transistor 12.

With transistors 14 and 12 fully conductive it will be seen that there is provided a circuit for a flow of current by way of the positive side of battery 24, resistor 26, the parallel connected resistors 17 and capacitor 18, transistor 14, transistor 12 and to the negative side of battery 28. In this manner capacitor 18 charges in the manner previously described for capacitor 20 and in addition there is a potential drop produced across resistor 26. Accordingly, the potential at point A is no longer at the positive potential of battery 24 but has decreased in a negative direction as shown by waveform A in FIG. 2 at time $T_3$. It will be understood that this negative change in potential may be considered to be a negative triggering pulse and may improperly switch the next succeeding flip-flop $n+1$ if point A were directly connected to the base of trigger transistor 12*a* of flip-flop $n+1$. However, in accordance with the present invention there is provided a connecting circuit 35 between point A and the base of trigger transistor 12*a* which will later be described in detail.

Upon application of the next triggering pulse to trigger transistor 12, the switching action previously described again takes place and transistor 12 is rendered non-conductive to turn off transistors 14 and 15. At that time, $T_4$, the potential at point A again increases to the positive potential of battery 24 as indicated by the reference character E in FIG. 2. At the termination of the negative trigger pulse transistor 12 is turned on and the flip-flop *n* is switched from its previous stable state so that transistor 15 is conductive and transistor 14 is non-conductive. Thus the potential at point A decreases to substantially ground potential as previously described and is shown in FIG. 2. In this manner the flip-flop *n* has returned to the stable state previously described and the switching function continues for subsequent triggering pulses applied to the base of transistor 12.

In order to explain the operation of the connecting circuit 35 with relation to the above described waveform, it will again be assumed that it is time $T_1$ and transistor 15 is on and transistor 14 is off. At that time point A is at a ground potential and a diode 36 is rendered conductive by reason of a circuit which may be traced by way of the positive side of battery 24, a resistor 38, point B, the anode and cathode of diode 36, point A, conductive transistor 15, conductive transistor 12 to battery 24. With diode 36 conductive or on the point B is at substantially the potential of point A, as shown in FIG. 2.

However at time $T_2$ when the potential at point A increases in a positive direction diode 36 is turned off since its cathode is now more positive than its anode. At time the potential at point B slowly increases in a positive direction by reason of a capacitor charging circuit which may be traced by way of the positive side of battery 24, resistor 38, a capacitor 40, point C, the base and emitter of conductive triggering transistor 12*a* to ground. In this manner as capacitor 40 charges with its left hand plate positive, with respect to its right hand plate the potential at point B increases in a positive direction as illustrated in FIG. 2 that positive going potential increase at point B produces a relatively small positive going pulse at point C between times $T_2$ and $T_3$. This positive going pulse is in a direction to turn on the already conductive trigger transistor 12*a* and thus has no adverse effect. The charging time of capacitor 40 is dependent on the time constant deteremined by the value of resistor 38 and capacitor 40. That time constant is selected to be of longer duration than the negative triggering pulse so that the negative going pulse D is eliminated at point B. In addition the time constant is selected so that the potential at point B reaches its maximum value before the time of the next triggering pulse. It will now be understood that in accordance with the invention the error caused by the negative-going pulse D is eliminated at point B and that pulse is not applied as a triggering pulse to the trigger transistor 12*a*.

At time $T_4$ at the change of stable state of flip-flop *n*, transistors 15 and 12 are rendered conductive and the potential at point A drops sharply in a negative-going direction. Thus diode 36 is rendered conductive and a large negative current is applied by way of the charged capacitor 40 which provides a negative trigger pulse for transistor 12*a*. In the manner previously described a sharp negative trigger pulse immediately turns off transistor 12*a*. Thus when flip-flop *n* switches at time $T_4$ with transistor 15 being switched from its non-conductive to its conductive state a triggering pulse is produced at point C which is effective to trigger the next succeeding flip-flop $n+1$ from one to the other of its stable states. Thus for every two input negative triggering pulses applied to flip-flop *n* there is produced one triggering pulse to flip-flop $n+1$. In like manner for every two input triggering pulses applied to flip-flop $n+1$ one triggering pulse is applied by way of a connecting circuit 35*a* for application to the next succeeding flip-flop $n+2$ (not shown).

It is to be understood that flip-flops *n*, $n+1$ etc. may be of the other types well known in the art in which one input triggering circuit is effective to switch the flip-flop from one to the other of its stable or conductivity states. It will also be understood that transistors 12, 14 and 15 for example may be of the PNP type, preferably of the switching type adapted to computer applications with corresponding reversal of the polarity of battery 24.

The principles of the invention having now been explained together with modifications thereof, it is to be understood that many more modifications may be made all within the spirit and scope of the following claims.

What is claimed is:

1. A system having at least two flip-flop circuits connected in a chain comprising each of said flip-flop circuits including a pair of cross-connected transistors switchable between two stable states in which one of said transistors is rendered conductive when the other is non-conductive and vice versa, triggering means for each of said flip-flop circuits having applied thereto a triggering signal for rendering the conductive one of said transistors non-conductive and for maintaining non-conductive the non-conductive one of said transistors whereby upon termination of said triggering pulse the previously non-conductive transistor is rendered conductive for switching the stable state of said cross-connected transistors, connecting means coupled between one of said transistors of each flip-flop circuit and said triggering means of the next succeeding flip-flop in the chain including diode means which is rendered conductive when said flip-flop switches to one of its two stable states and is rendered non-conductive when said flip-flop switches to the other of its stable states, each said connecting means including capacitor means connected between said diode means and said triggering means, and source means for producing a charging current for flow through said capacitor means when said diode means is rendered non-conductive whereby when said diode means is rendered conductive a triggering signal is applied to said triggering transistor of the next succeeding flip-flop.

2. The system of claim 1 in which each said diode means and capacitor means comprises a diode and a capacitor connected in series circuit relation with the side of said capacitor remote from said diode being connected to said triggering means of the next succeeding flip-flop and the side of said diode remote from said capacitor being connected to the collector of said one transistor.

3. The system of claim 2 in which said triggering means comprises a triggering transistor having its base connected to a respective capacitor and its collector connected to both emitters of the respective pair of transistors whereby said triggering pulse is effective to render said triggering transistor non-conductive only during the time of said pulse.

4. The system of claim 2 in which said source means includes a source of supply and a resistor connected to the common connection of said diode and said capacitor for producing said charging current.

5. A switching system for preventing error triggering having at least two flip-flop circuits connected in a chain in which a triggering pulse produced by a flip-flop is applied to switch the next succeeding flip-flop in the chain comprising, each of said flip-flop circuits including a pair of transistors having two stable states, circuits respectively cross-connected to the collector of each transistor to the base of the other transistor, each of said cross-connecting circuits applying a signal from the output of one transistor to the input of the other transistor for rendering one of them conductive when the other is non-conductive and vice versa, triggering means for each of said flip-flop circuits having applied thereto triggering pulses of polarity for rendering the conductive one of said transistors non-conductive and for maintaining non-conductive the non-conductive one of said transistors whereby upon termination of said triggering pulse the previously non-conductive transistor is rendered conductive thereby to switch the stable state of said flip-flop circuit, connecting means coupled between an output of one of said transistors of each flip-flop circuit and said triggering means of the next succeeding flip-flop in the chain including diode means which is rendered conductive when said one transistor is conductive and is rendered non-conductive when said one transistor is non-conductive.

each said connecting means including capacitor means connected between said diode means and said triggering means, and source means for producing a charging current for flow through said capacitor means when said diode means is rendered non-conductive to prevent a triggering pulse from being applied to said triggering means whereby when said diode means and one transistor are rendered conductive a sharp triggering pulse is applied to said triggering means.

6. The switching system of claim 5 in which each of said diode means comprises a diode and a capacitor connected in series circuit relation with the side of said capacitor remote from said diode being connected to said triggering means of the next succeeding flip-flop and the side of said diode remote from said capacitor being connected to the collector of said one transistor.

7. The switching system of claim 6 in which each of said diodes is poled and said source means has a polarity for rendering conductive said diode when said one transistor is rendered conductive.

8. The switching system of claim 6 in which each said triggering means comprises a triggering transistor having its base connected to a respective capacitor and its collector connected to both emitters of the respective pair of transistors whereby said triggering pulse is effective to render said triggering transistor non-conductive only during the time of said pulse.

9. The system of claim 6 in which said source means includes a source of supply and a resistor connected to the common connection of said diode and said capacitor for producing said charging current.

10. A binary counter having at least two flip-flop circuits connected in a chain in which a triggering pulse produced by a flip-flop is applied to switch the next succeeding flip-flop in the counter and error triggering pulses are prevented comprising each of said flip-flop circuits including a pair of transistors having two stable states, circuits including coupling capacitors respectively cross-connected to the collector of each transistor to the base of the other transistor, each of said cross-connecting circuits applying a signal from the output of one transistor to the input of the other transistor for rendering one of them conductive when the other is non-conductive and vice versa, triggering means including a normally conductive triggering transistor for each of said flip-flop circuits having applied thereto triggering pulses of plurality to render non-conductive said triggering transistor for rendering the conductive one of said pair of transistors non-conductive and for maintaining non-conductive the non-conductive one of said pair of transistors whereby upon termination of said triggering pulse the previously non-conductive one of said pair is rendered conductive thereby to switch the stable state of said flip-flop circuit, connecting means coupled between an output of one of said transistors of each pair of transistors and said triggering transistor of the next suceeding flip-flop in the chain including a diode which is rendered conductive when said one transistor is conductive and is rendered non-conductive when said one transistor is non-conductive, each said connecting means including a capacitor connected between said diode and said triggering transistor, and a source of supply connected to said capacitor for producing a charging current for flow through said capacitor when said diode is rendered non-conductive to produce a pulse only in a direction to render conductive said triggering transistor whereby only when said diode and one transistor are rendered conductive said capacitor discharges and a sharp triggering pulse is applied to said triggering transistor to switch the stable state of the next succeeding flip-flop.

References Cited by the Examiner

UNITED STATES PATENTS

| | | | |
|---|---|---|---|
| 3,165,646 | 1/1965 | De Bottari et al. | 307—88.5 |
| 3,165,647 | 4/1965 | De Bottari et al. | 307—88.5 |
| 3,181,011 | 4/1965 | Durio | 307—88.5 |
| 3,246,167 | 4/1966 | Ward | 307—88.5 |

ARTHUR GAUSS, *Primary Examiner.*

J. S. HEYMAN, *Assistant Examiner.*